United States Patent [19]
Tyler et al.

[11] Patent Number: 5,715,184
[45] Date of Patent: Feb. 3, 1998

[54] METHOD OF PARALLEL SIMULATION OF STANDARD CELLS ON A DISTRIBUTED COMPUTER SYSTEM

[75] Inventors: Sean C. Tyler; Binay J. George; Markus G. Wloka, all of Chandler, Ariz.

[73] Assignee: Motorola, Inc., Schaumburg, Ill.

[21] Appl. No.: 376,253

[22] Filed: Jan. 23, 1995

[51] Int. Cl.$^6$ ..................... G06F 3/00
[52] U.S. Cl. .......... 364/578; 395/500; 395/200.01; 364/488; 364/489; 364/490; 364/491
[58] Field of Search ............ 395/900, 200.01–200.09; 364/978, 488, 489, 490, 491

[56] References Cited

U.S. PATENT DOCUMENTS 5,519,848  5/1996  Wloka et al. ..................... 395/500

OTHER PUBLICATIONS

"Development of Parallelism for Circuit Simulation by Tearing" European Design Auto Conf. IEEE 1993, pp. 12–17 (H. Onozuka et al.).

"Circuit Partitioning for Multiprocessor SPICE". IEEE Tencon 1993, pp. 1186–1189 (X. D. Jia et al.).

*Primary Examiner*—Kevin J. Teska
*Assistant Examiner*—A. S. Roberts
*Attorney, Agent, or Firm*—Robert D. Atkins

[57] ABSTRACT

A computer implemented method provides for simulation standard cells from an integrated circuit design in parallel on a distributed simulation system. The integrated circuit design (10) is divided into a plurality of standard cells (12–18). Characterization parameters such as temperature, process, supply voltage, edge rate and capacitive load are individually assigned (34) to each one of the standard cells. A first one (12) of the standard cells is scheduled (36) and dispatched (38) for simulation in a first computer workstation (22) on the distributed simulation system (20). A second one (14) of the standard cells is scheduled and dispatch for execution in a second computer workstation (24) on the distributed simulation system during the simulation of the first standard cell. The results of the first and second simulations are stored (40) upon completion of the respective simulation tasks.

20 Claims, 1 Drawing Sheet

METHOD OF PARALLEL SIMULATION OF STANDARD CELLS ON A DISTRIBUTED COMPUTER SYSTEM

CROSS REFERENCE TO RELATED PATENT APPLICATIONS

The present application is related to copending U.S. patent application Ser. No. 08/154,054, Attorney's Docket SC08542S, entitled "A METHOD OF CELL CHARACTERIZATION IN A DISTRIBUTED SIMULATION SYSTEM", filed Nov. 18, 1993, by Markus G. Wloka et al and assigned to the same assignee, Motorola, Inc.

BACKGROUND OF THE INVENTION

The present invention relates in general to software engineering and, more particularly, to a method of parallel simulation of standard cells on a distributed computer system.

Electronic circuit designs are often categorized according to full-custom and semi-custom implementations. In full-custom designs, circuit components such as transistors, resistors, and capacitors are individually laid out and interconnected to provide a predetermined function. Full-custom designs typically yield the most optimal use of space, performance, and efficiency but generally require the most effort in layout and simulation. In semi-custom designs, standard cell libraries of predefined circuit functions are used as building blocks for more complex systems. For example, standard cells operating as flipflops, inverters, and multiplexers may be interconnected to perform a logic function.

Whether the integrated circuit design is full-custom or semi-custom, it is useful to run a computer aided design (CAD) simulation such as SPICE to test the various features before a physical embodiment is built. The integrated circuit may be mathematically modeled in the computer simulator whereby the design parameters may be verified or manipulated to work out the inevitable problems associated with different embodiments before proceeding with the cost and effort of building an actual model.

When performing a SPICE simulation, the time required for full simulation grows exponentially with circuit size. Therefore, full simulations of large full-custom designs can be extraordinarily time-consuming jobs. Each simulation may take many hours or even days to complete even on modern mainframe and mini-supercomputer systems depending on the complexity of the design. Indeed, it is often necessary to divide the full-custom design into logical blocks because the entire design cannot be loaded onto a single computer simulator.

Semi-custom designs not only simplify the layout but can also greatly reduce the CAD simulation process. The standard cells are individually characterized by an abstract model of timing or power equations, or table look-up, that estimate their behavior over a variety of parameters. Each cell is simulated with its characteristic equation as a function of physical parameters such as output capacitive loading, input signal edge rate, temperature, supply voltage, and process conditions. The results of each cell simulation, commonly called an instance, are summed together to get the overall effect. For example, the delay through the critical path of the integrated circuit is determined by summing the individual delays of the cell instances that form the critical path. Hence, it is easier and faster to simulate a few logic gates from an abstract model rather than perform a full SPICE transistor level simulation of the entire system.

Unfortunately, the abstract simulation of individual cells with their characteristic equations causes inaccuracy in the overall model of say 20% or more. The inaccuracies in simulating the cells force system designers to take worst case models and de-rate the cells from optimal performance to ensure proper operation in the final system. Moreover, semi-custom designs tend to have larger transistors, unnecessary functions, and less than optimal packing in the standard cells. The inaccuracies and large circuits associated with semi-custom designs are trade-offs for reduced design cycle time as compared to full-custom designs. While the designers can often accept larger circuits, it is desirable to obtain more accurate simulations from the semi-custom designs especially in the critical path.

DETAILED DESCRIPTION OF THE PREFERRED EMBODIMENT

Figure 1:
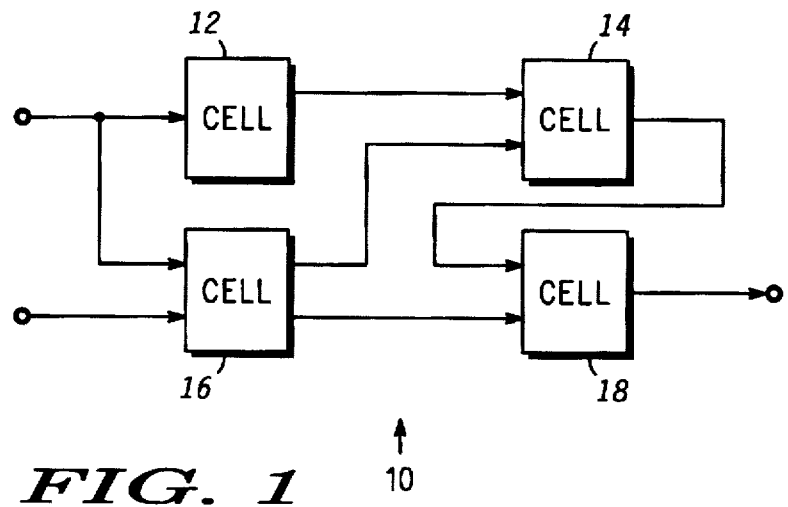
FIG. 1 is a simplified block diagram illustrating an integrated circuit with standard cells.

Referring to FIG. 1, a semi-custom integrated circuit design 10 is shown with four standard cells 12, 14, 16 and 18 from a library that are interconnected to perform a circuit function. For example, standard cell 12 may be an inverter, while standard cell 14 is a NAND gate. Standard cell 16 may be a D-type flipflop with complementary outputs, while standard cell 18 is a two-input multiplexer. A typical semi-custom design has many more standard cells to perform a useful function.

Once the standard cells are selected for the desired circuit function, it is useful to run a computer aided design (CAD) simulation such as SPICE to test the various features before a physical embodiment is built. The integrated circuit is mathematically modeled in the computer simulator whereby the design parameters may be verified or manipulated to work out the inevitable problems associated with different embodiments before proceeding with the cost and effort of building an actual model. A SPICE transistor level simulation is well known for providing accurate modeling of a circuit. The present invention is applicable to any circuit simulator and any technology, e.g. bipolar, CMOS, ECL, etc.

As noted in the background, a full SPICE simulation of the entire integrated circuit on a single computer simulator takes too long for complex designs. Moreover, the integrated circuit simulation may exceed the physical capacity of the circuit simulator. The most common approach is to break the circuit into large blocks that will fit on the simulator and then simulate the blocks one at a time. Another approach is to simulate individual cells with their characteristic equations; however, such short-cuts cause inaccuracies in the model which creates a problem especially in evaluating the critical path through the integrated circuit.

Figure 2:
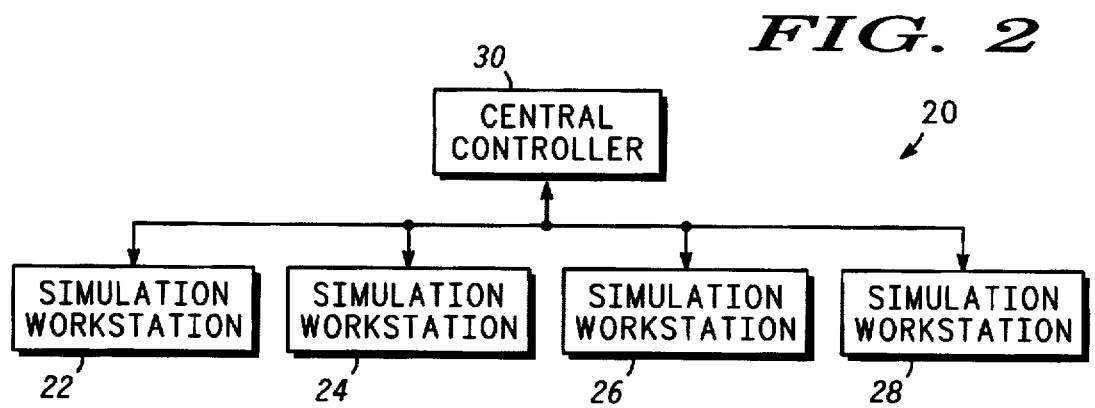
FIG. 2 is a simplified block diagram of a distributed computer simulation system.

As a feature of the present invention, standard cells 12–18 are individually simulated in parallel with a distributed computer simulation system 20 such as shown in FIG. 2. That is, cell 12 is simulated in a first computer simulator workstation 22 while simultaneously cell 14 is simulated in a second computer simulator workstation 24. Cell 16 is simulated in a third computer simulator workstation 26, and cell 18 is simulated in a fourth computer simulator workstation 28. Central controller 30 controls the scheduling and dispatch of simulations.

By performing a SPICE transistor level simulation on the individual cells each in their own computer simulator in parallel, the simulation results are very accurate while the simulation time is greatly reduced. For example, if integrated circuit 10 included 1000 standard cells, then the parallel simulation could run on a network of 1000 computer simulators. When the cell simulations are run in parallel, the simulation time $T_{SIM}$ is determined by the average complexity of the cells and associated overhead for scheduling and network communications.

$$T_{SIM} = T_{JOB} \cdot N_{JOBS} / N_{WS} \cdot e$$

where: $T_{JOB}$ is average simulation time per cell $N_{JOBS}$ is the number of jobs $N_{WS}$ is the number of workstations $e$ is the parallel efficiency with overhead Alternately, a fewer number of workstations could be used, say between 10 and 100, to run simulations for the 1000 standard cells. Central controller 30 schedules parallel simulations on the available computer workstations. The cells not yet simulated await dispatch in a queue. When a simulation completes, the results are stored back in central controller 30 which then dispatches another simulation. The workstations run in parallel until all simulations are complete. Thus, the present invention provides the advantage of accurate SPICE transistor level computer simulation while reducing simulation time as the standard cells are simulated in distributed computer workstations operating in parallel.

Figure 3:
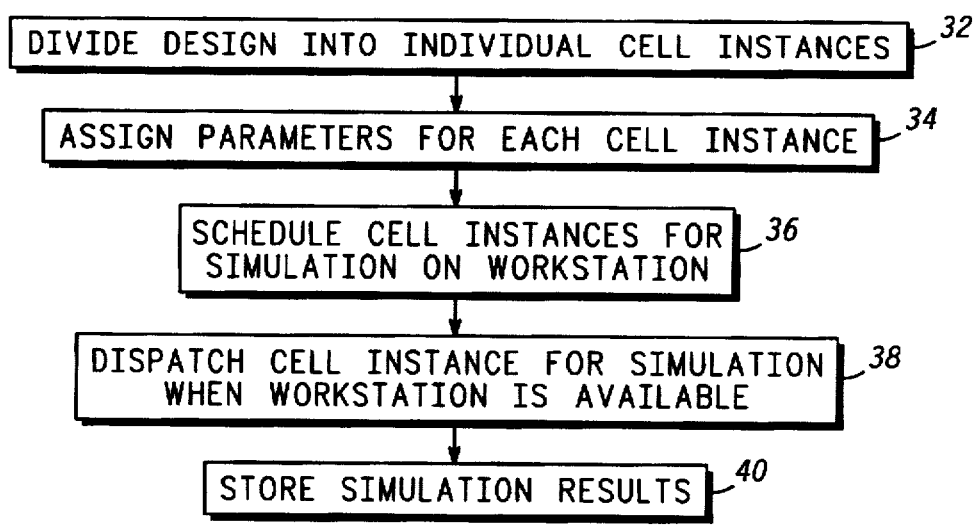
FIG. 3 is a flowchart illustrating the parameter assignment, scheduling and dispatching steps for the standard cells of FIG. 1.

The methodology for parallel simulation of the individual cells in shown in FIG. 3. The methodology is executed by a computer program running on central controller 30. Timing and power parameters are primary concerns and must be evaluated for a range of operating temperatures, supply voltages, etc. Timing parameters define how quickly the circuit can be cycled while power parameters determine how many watts are consumed during active and idle modes.

In step 32, integrated circuit 10 is divided into individual cell instances 12–18. The cells are each characterized by assigning parameters such as temperature, input signal edge rate, supply voltage, process conditions, and capacitive loading in step 34. Parameters such as input signal edge rate and capacitive loading are typically different for each cell. In step 36, one cell instance is scheduled for simulation on one of the simulation workstations 22–28 of distributed computer network 20. Scheduling involves placing a cell with its parameters in a queue awaiting its turn for simulation in the next available workstation. In step 38, the cell at the head of the scheduling queue is dispatched for simulation on the assigned workstation. Once the first cell is dispatched, a second cell in the queue is scheduled and dispatched for simulation provided a workstation is available. Steps 36 and 38 are repeated until all cells are simulated.

The cell simulations should all run in parallel for maximum speed. If there are enough workstations for every cell, then the scheduling and dispatch occurs quickly one after another until the queue is empty. Once a simulation is complete, the simulation results are returned to the central controller 30 in step 40. If there are not enough workstations for every cell, several cells are scheduled and dispatched for execution in the available workstations while other cells await their turn in the scheduling queue. When one cell completes execution, the next waiting cell is dispatched for simulation. For example, central controller 30 schedules cells 12–18 for simulation and then dispatches cells 12, 14, 16, and 18 into workstations 22, 24, 26, and 28, respectively. Any other cells would wait in the scheduling queue. If cell 12 finished simulation and workstation 22 became available, the next cell in the queue would be dispatched for simulation. The workstations run simulations in parallel until all cell simulations are complete.

The scheduling of remote computing jobs is believed well known in the art. For the implementation of the present invention, the Linda computer language may be used for scheduling. Linda is a coordination computer language for asynchronous parallel processing. Linda includes a host language, such as Fortran or C, plus an associative distributed memory, called tuple space, and operations IN(), OUT(), READ(), and EVAL() to write data, read and remove data, read data, and start a remote simulator, respectively. One scheduling technique is disclosed in U.S. patent application Ser. No. 08/154,054 noted above.

Once the standard cells 12–18 have been simulated, the delay through the critical path can be determined by the sum of delays through the cells that make up the critical path. The delay through the critical path is important because it determines the maximum operating speed of the integrated circuit. Alternately, if the critical path can be determined before the simulation, the parallel SPICE transistor level simulation need only be performed on the cells that are part of the critical path for maximum accuracy. The scheduling process allows selection of cells that are in critical path. The remaining cells in the integrated circuit may be simulated by their characteristic equations.

The present invention is equally applicable to power calculations. The parallel simulation typically returns the energy dissipated by the individual cells. To determine power dissipation, the energy is multiplied by the operation frequency of the cell. In an alternate embodiment, the circuit simulation may check setup and hold times and pulse widths of sequential logic circuits.

By now it should be appreciated that the present invention provides SPICE-type computer simulation accuracy of standard cells while performing multiple simulations in parallel to reduce the simulation time. The integrated circuit may be built with standard cells to reduce design time. The standard cells are scheduled for individual SPICE-type simulation in parallel on distributed workstations. The simulation results are stored on a central controller to calculate important characteristics such as critical path delay, power consumption, setup and hold times, and pulse widths.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of simulating cells in parallel on a distributed simulation system, comprising the steps of:

dividing a circuit design into a plurality of cells;

assigning simulation parameters to each one of said plurality of cells;

scheduling a first one of said plurality of cells including said simulation parameters for simulation on the distributed simulation system;

dispatching said first one of said plurality of cells including said simulation parameters for execution in a first computer workstation on the distributed simulation system;

scheduling a second one of said plurality of cells including said simulation parameters for simulation on the distributed simulation system; and dispatching said second one of said plurality of cells including said simulation parameters for execution in a second computer workstation on the distributed simulation system during the simulation of said first one of plurality of cells.

2. The method of claim 1 further including the step of storing simulation results upon completion of the simulation of said first one of said plurality of cells.

3. The method of claim 2 further including the step of storing simulation results upon completion of the simulation of said second one of said plurality of cells.

4. The method of claim 3 wherein said step of assigning simulation parameters includes the step of assigning a temperature parameter.

5. The method of claim 4 wherein said step of assigning simulation parameters includes the step of assigning a supply voltage parameter.

6. The method of claim 5 wherein said step of assigning simulation parameters includes the step of assigning a process condition parameter.

7. The method of claim 6 wherein said step of assigning simulation parameters includes the step of assigning an input signal edge rate parameter.

8. The method of claim 7 wherein said step of assigning simulation parameters includes the step of assigning a capacitive loading parameter.

9. The method of claim 8 further including the step of measuring energy dissipation in said first one of said plurality of cells and calculating power dissipation by multiplying said energy dissipation by an operating frequency of said first one of said plurality of cells.

10. A computer implemented method of parallel simulation of standard cells in a distributed simulation system, comprising the steps of:

assigning simulation parameters for each one of a plurality of standard cells;

scheduling a first one of said plurality of standard cells including said simulation parameters for simulation on the distributed simulation system;

dispatching said first one of said plurality of standard cells including said simulation parameters for execution in a first computer workstation on the distributed simulation system;

scheduling a second one of said plurality of standard cells including said simulation parameters for simulation on the distributed simulation system; and dispatching said second one of said plurality of standard cells including said simulation parameters for execution in a second computer workstation on the distributed simulation system during the simulation of said first one of plurality of standard cells.

11. The method of claim 10 further including the step of storing simulation results upon completion of the simulation of said first one of said plurality of standard cells.

12. The method of claim 11 further including the step of storing simulation results upon completion of the simulation of said second one of said plurality of standard cells.

13. The method of claim 12 wherein said step of assigning simulation parameters includes the step of assigning a temperature parameter.

14. The method of claim 13 wherein said step of assigning simulation parameters includes the step of assigning a supply voltage parameter.

15. The method of claim 14 wherein said step of assigning simulation parameters includes the step of assigning a process condition parameter.

16. The method of claim 15 wherein said step of assigning simulation parameters includes the step of assigning an input signal edge rate parameter.

17. The method of claim 16 wherein said step of assigning simulation parameters includes the step of assigning a capacitive loading parameter.

18. The method of claim 17 further including the step of measuring energy dissipation in said first one of said plurality of standard cells and calculating power dissipation by multiplying said energy dissipation by an operating frequency of said first one of said plurality of standard cells.

19. A computer implemented method of simulating standard cells from an integrated circuit design in parallel on a distributed simulation system, comprising the steps of:

dividing the integrated circuit design into a plurality of standard cells;

assigning temperature, process, supply voltage, edge rate and capacitive load simulation parameters to each one of said plurality of standard cells;

scheduling a first one of said plurality of standard cells including said simulation parameters for simulation on the distributed simulation system;

dispatching said first one of said plurality of standard cells including said simulation parameters for execution in a first computer workstation on the distributed simulation system;

scheduling a second one of said plurality of standard cells including said simulation parameters for simulation on the distributed simulation system; and dispatching said second one of said plurality of standard cells including said simulation parameters for execution in a second computer workstation on the distributed simulation system during the simulation of said first one of plurality of standard cells.

20. The method of claim 19 further including the steps of:

storing simulation results upon completion of the simulation of said first one of said plurality of standard cells; and storing simulation results upon completion of the simulation of said second one of said plurality of standard cells.

* * * * *